United States Patent [19]
Umeya et al.

[11] Patent Number: 5,489,449
[45] Date of Patent: Feb. 6, 1996

[54] COATED PARTICLES OF INORGANIC OR METALLIC MATERIALS AND PROCESSES OF PRODUCING THE SAME

[75] Inventors: Kaoru Umeya, 1-30-13, Yagiyamahon-cho, Taihaku-ku, Sendai-shi, Miyagi-ken; Yukiyoshi Yamada, Saitama; Tadashi Fuyuki, Saitama; Eisuke Kuroda, Saitama; Satoshi Akiyama, Saitama, all of Japan

[73] Assignees: Nisshin Flour Milling Co., Ltd., Tokyo; Kaoru Umeya, Sendai, both of Japan

[21] Appl. No.: 276,496

[22] Filed: Jul. 18, 1994

Related U.S. Application Data

[63] Continuation of Ser. No. 15,894, Feb. 10, 1993, abandoned, which is a continuation of Ser. No. 676,445, Mar. 28, 1991, abandoned.

[30]  Foreign Application Priority Data

Mar. 28, 1990 [JP] Japan ................. 2-76750

[51] Int. Cl.$^6$ ................. C23C 4/10; C23C 4/06; B05D 1/08; B05D 7/00
[52] U.S. Cl. ................. 427/450; 427/446; 427/452; 427/453; 427/455; 427/456; 427/213; 427/215; 427/217
[58] Field of Search ................. 428/403, 570, 428/404, 901, 934, 936, 938; 427/124, 126.1, 126.2, 126.3, 213, 215, 216, 217, 446, 450, 451, 452, 453, 454, 455, 456, 562, 563, 564

[56]  References Cited

U.S. PATENT DOCUMENTS

| | | | |
|---|---|---|---|
| 3,247,014 | 4/1966 | Goldberger et al. | 427/450 |
| 3,871,840 | 3/1975 | Wilder et al. | 427/215 |
| 4,063,907 | 12/1977 | Lee et al. | 427/217 |
| 4,397,885 | 8/1983 | Akai et al. | 427/562 |
| 4,399,167 | 8/1983 | Pipkin | 427/217 |
| 4,435,189 | 3/1984 | Bovenkerk | 427/217 |
| 4,532,155 | 7/1985 | Golant et al. | 427/213 |
| 4,593,007 | 6/1986 | Novinski | 427/423 |
| 4,617,237 | 10/1986 | Gupta et al. | 428/446 |
| 4,689,242 | 8/1987 | Pike | 427/451 |
| 4,746,547 | 5/1988 | Brown et al. | 427/213 |
| 4,749,595 | 6/1988 | Honda et al. | 427/213 |
| 4,788,080 | 11/1988 | Hojo et al. | 427/213 |
| 4,818,837 | 4/1989 | Pfender | 427/446 |
| 4,911,805 | 3/1990 | Ando et al. | 427/446 |
| 4,915,987 | 4/1990 | Nara et al. | 427/180 |
| 4,944,985 | 7/1990 | Alexander et al. | 428/570 |
| 4,994,107 | 2/1991 | Flagan et al. | 75/367 |
| 5,075,138 | 12/1991 | Tanaka et al. | 427/213 |
| 5,164,220 | 11/1992 | Caballero | 427/215 |
| 5,217,747 | 6/1993 | Tsantrizos et al. | 427/455 |
| 5,268,201 | 12/1993 | Komaki et al. | 427/215 |

FOREIGN PATENT DOCUMENTS

| | | | |
|---|---|---|---|
| 61-207526 | 9/1986 | Japan . | |
| 1242469 | 9/1989 | Japan . | |
| 3076110 | 4/1991 | Japan | 427/584 |
| 581151 | 10/1946 | United Kingdom . | |
| 1018185 | 1/1966 | United Kingdom . | |
| 1132003 | 10/1968 | United Kingdom . | |
| 1196029 | 6/1970 | United Kingdom . | |
| 1359933 | 7/1974 | United Kingdom . | |
| 2018664 | 10/1992 | WIPO | 427/450 |

OTHER PUBLICATIONS

Ceramic Bulletin, vol. 60, No. 2, pp. 221–224 and 243. No month (1981) David W. Johnson, Jr. "Nonconventional Powder Preparation Techniques."

*Primary Examiner*—Marianne Padgett
*Attorney, Agent, or Firm*—Oblon, Spivak, McClelland, Maier & Neustadt

[57]  ABSTRACT

A particle of an inorganic or metallic material which is coated on the surface with ultrafines of an inorganic or metallic material. The coated particle is produced by introducing the particles of the inorganic or metallic material to be coated into a stream carrying the ultrafines of the inorganic or metallic material formed in a vapor phase and bringing the particles to be coated into contact with said ultrafines in a fluidized state. The coated particles are used for the production of a sintered product.

11 Claims, 1 Drawing Sheet

COATED PARTICLES OF INORGANIC OR METALLIC MATERIALS AND PROCESSES OF PRODUCING THE SAME

This application is a continuation of application Ser. No. 08/015,894, filed on Feb. 10, 1993, now abandoned, which is a continuation of Ser. No. 07/676,445, filed on Mar. 28, 1991, now abandoned.

FIELD OF THE INVENTION

The invention relates to coated particles of inorganic non-metallic or metallic materials and more particularly to those coated on the surface with ultrafines of inorganic non-metallic or metallic materials. It also relates to processes of producing the coated particles. The coated particles of the invention are useful for the production of sintered products.

BACKGROUND OF THE INVENTION

Sintered products of inorganic non-metallic or metallic powders have been used as electrical insulating materials such as semiconductor substrates, printed circuit boards, electrical insulating parts; high-hardness and high-precision machining materials such as cutting tools, dies, bearings; functional materials such as grain boundary capacitors, humidity sensors; and precise sinter molding materials.

When inorganic non-metallic or metallic powders are sintered to produce a sintered product, it is often the procedure in the art to add a sinter additive to the powders for such a purpose as lowering the sintering temperature and/or improving the physical properties of the sintered products.

We have proposed in Japanese Patent Application No. 68037/1988 (Patent Kokai H 1-242469) that ultrafines of yttrium oxide are added as a sinter additive to aluminum nitride powders to increase the reactivity between the powders and the additive, thereby providing improved sintering characteristics and improved physical properties of the sintered product. This process is one of mixing of two components, i.e., sintering inorganic powders and ultrafines of the sinter additive which are separately prepared. It requires homogeneous mixing of the two components to be sintered. In this case, ultrafines of the additive have an increased tendency to agglomerate. The mixing operation must be performed very carefully while maintaining the two components in highly dispersed state. Thus, the prior process is not satisfactory for the production of the sintered product.

SUMMARY OF THE INVENTION

We have further investigated the prior art and found that, if the sinter assistant can be deposited in the form of ultrafines on the surface of the sintering powder to form an integral body, the disadvantages of the prior art processes can be overcome, thus achieving simplified handling of powder materials and simplified production of a sintered compact with increased homogeneity and high quality.

In its primary aspect, the invention is directed to a particle of an inorganic non-metallic or metallic material which is coated on the surface with ultrafines of an inorganic non-metallic or metallic material.

In a further aspect, the invention is directed to a process of producing a particle of an inorganic non-metallic or metallic material which is coated on the surface with ultrafines of an inorganic non-metallic or metallic material, which comprises the steps of introducing the particles of the inorganic non-metallic or metallic material to be coated into a stream carrying the ultrafines of the inorganic or metallic material formed in a vapor phase and bringing said particles to be coated into contact with said ultrafines in a fluidized state.

For convenience of explanation, the inorganic non-metallic or metallic material to be coated is called hereafter "core material". On one hand, the inorganic non-metallic or metallic material used for coating the core material is called hereafter "coating material". The term "ultrafines" as used herein refers to a powder composed of particles smaller than 0.5 micrometers (μm), usually 0.1 micrometers (μm).

DETAILED DESCRIPTION OF THE INVENTION

Figure 1:
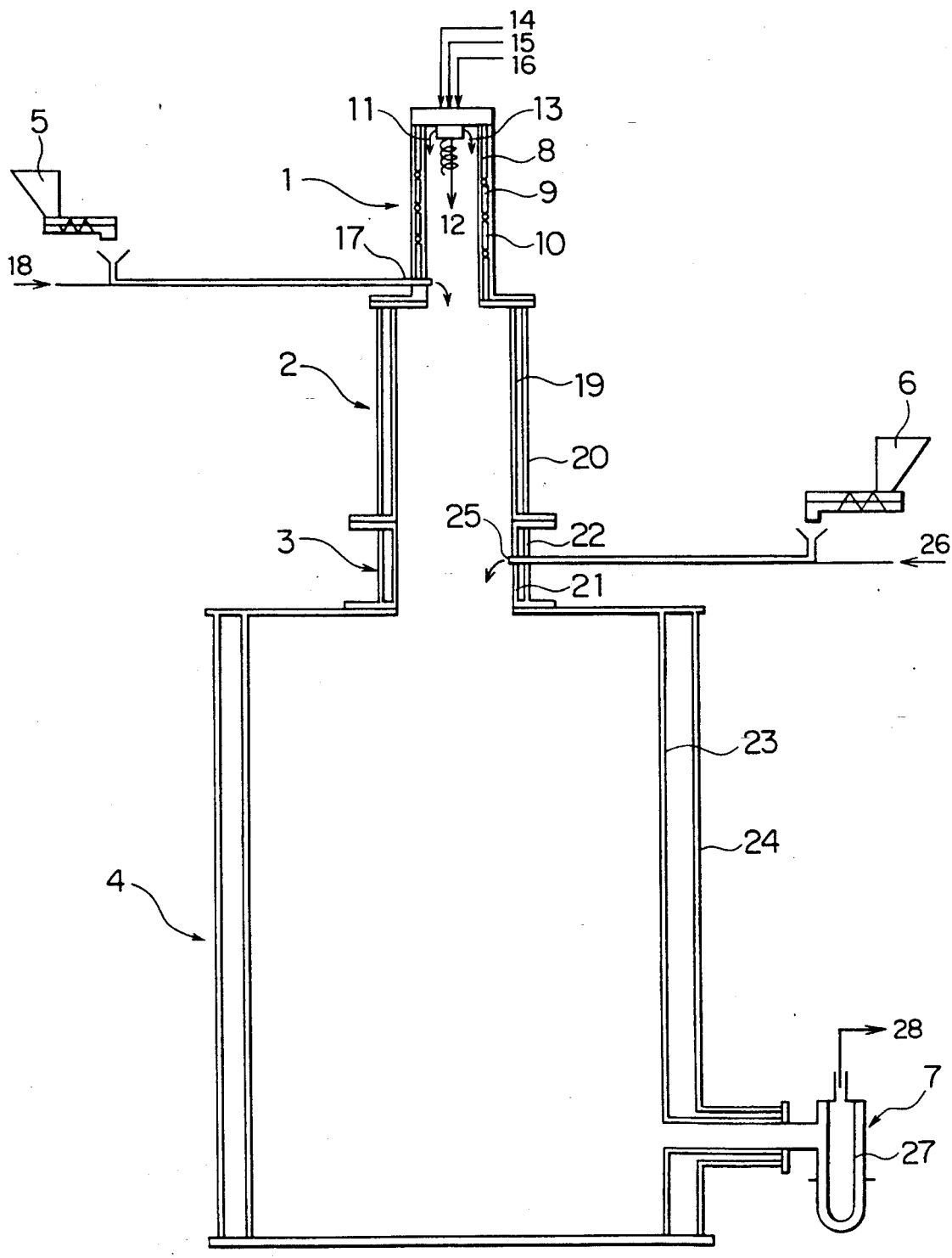
FIG. 1 is a schematic view for illustrating an example of the apparatus used in the practice of the invention.

In one embodiment, the coated particle of inorganic non-metallic or metallic materials can be produced by introducing the particle of a core material in a monodisperse state into a stream carrying the ultrafines of a coating material formed in a vapor phase by a Chemical Vapor Deposition (CVD) or a Physical Vapor Deposition (PVD) such as a Radio Frequency Plasma process (RF) and a laser process and contacting said ultrafines of the coating material with particles of the core material in a fluidized state to strongly deposit the ultrafines onto the surface of said core material. The coated particles of the invention thus produced are new powder materials for the production of a sintered product.

The core materials are composed of the inorganic non-metallic or metallic materials which include all inorganic materials known as refractory or ceramics, for example, oxides such as $Al_2O_3$, $ZrO_2$, $SiO_2$, BeO, MgO, CaO; nitrides such as $Si_3N_4$, AlN, BN; carbides such as SiC, WC; borides such as BP, BN; clay and minerals such as kaolin, montmorillonite, bentonite, vermiculite; magnetic materials including various ferrites; simple substances such as diamond, graphite; metals such as Si, Ni, Co, W, Ti, Al, Cu, Fe and others; intermetallic compounds and alloys such as Fe-Ni-Si alloy, Fe-Cr-Al alloy, Fe-Cr-Mo alloy, Fe-Ni-Cr alloy, Ni-Cr alloy and others; and composite materials thereof.

The particles of the core materials have usually an average particle size in the range of 0.1 μm to 100 μm, preferably 1 μm to 10 μm.

The coating materials are composed of the inorganic non-mettalic or metallic materials which include all inorganic materials, for example, oxides such as $Al_2O_3$, $SiO_2$, $ZrO_2$, $Y_2O_3$, CaO; nitrides such as $Si_3N_4$, AlN, BN; carbides such as SiC, WC; borides such as BP, BN; metals such as Si, Al, Ni, Co, Cu, Fe, Ti, W; simple non-metallic substances such as C, B and others; intermetallic compounds and alloys such as Fe-Ni-Si alloy, Fe-Cr-Al alloy, Fe-Cr-Mo alloy, Fe-Ni-Cr alloy, Ni-Cr alloy and others; and composite materials thereof. The coating materials may be the same as or different from the core materials as mentioned above, depending on the desired properties and functions of the coated particles.

The ultrafines of the coating materials have an average particle size in the range of 0.005 μm to 0.5 μm.

The ultrafines of the inorganic non-metallic or metallic materials used as the coating material can be prepared by known procedures, for example, as disclosed by David W. Johnson, JR, "Ceramic Bulletin", vol. 60, No. 2 (1981), pp. 221–224. Those procedures include physical means such as arc-discharge plasma jet, arc dissolution, high-frequency plasma, gas evaporation or chemical means such as reduction or oxidation of vapor of inorganic non-metallic or metallic materials or thermal decomposition of hydrocarbon or its derivatives.

In the practice of the invention, into a vapor stream containing the ultrafines of the coating material are introduced the particles of the core material by any means, e.g., in the form of a dispersant in a vapor phase carried by a carrier gas and the ultrafines are contacted with the particles of the core material in a fluidized state. In that case, the ultrafines are as prepared by the physical or chemical means and they are in a nascent state, i.e., in an activated state containing a free radical. When the ultrafines come into contact with the particles of the core material, the ultrafines will be covalently bonded to the particles, by which both particles are chemically bonded together strongly.

The contact of the ultrafines with the particles of the core material can be repeated if necessary, so that the proportion of the ultrafines coated on the surface of the core material can be set at the desired level. Further, the contact can be repeated using different kinds of the coating material, i.e., ultrafines of inorganic non-metallic or metallic materials, so that the materials of plural components can be multi-coated.

The proportion ratio of the ultrafines of the coating material to the particles of the core material can be varied over a wide range depending on the desired properties and function of the resultant coated particles. For instance, the ultrafines can be in the range of 0.01% to 60% by weight based on the particles of the core material.

The coated particles of the invention include $Si_3N_4$ particles coated with $Y_2O_3$ ultrafines; AlN particles coated with $Y_2O_3$ ultrafines; $Si_3N_4$ particles coated with $Y_2O_3$ ultrafines; $Si_3N_4$ particles coated with $Y_2O_3$ and $Al_2O_3$ ultrafines; diamond particles coated with Co ultrafines; diamond particles coated with carbon ultrafines obtained from thermal decomposition of methane gas; diamond particles coated with titanium ultrafines obtained from reduction of titanium chloride; and diamond particles coated with Ti ultrafines and titanium-copper alloy ultrafines obtained from titanium and copper powders.

The coated particles of the invention can be employed as a raw material for the production of a sintered product, either in the form of coated particles alone or together with the ultrafines remaining in the coating process.

In particular, the advantages of the coated particles wherein the ultrafines of the inorganic non-metallic or metallic materials are chemically bonded strongly onto the surface of the particles of the inorganic non-metallic or metallic materials can be obtained when used as a raw material for the sintered compact. That is, a sintering process using the coated particles of the invention can achieve the advantages of premature sintering of the sintered compact (reduced sintering time and temperature), reduced amount of the sinter additive, increased strength of the sintered compact or the like, in contrast with the prior sintering process using a mixture of a raw powder material and a sinter additive.

The invention will be better understood by reference to the following examples.

EXAMPLE 1

Yttrium oxide ($Y_2O_3$) powders having an average particle size of 0.5 μm (coating material) were introduced into a high-temperature plasma produced by a radio-frequency heating of a 1:4 mixed gas of argon and nitrogen to form a gas stream carrying a raw powder of $Y_2O_3$. Into the gas stream were introduced particles of silicon nitride ($Si_3N_4$) having an average particle size of 0.5 μm (core material) as a dispersant in an argon carrier gas to produce the coated particles wherein $Si_3N_4$ particles were coated on the surface with $Y_2O_3$ ultrafines.

An apparatus used in the above procedure is shown in FIG. 1.

The apparatus comprises a plasma torch 1, a double-walled quartz tube 2, a double-walled cooling tube 3, a chamber 4, a feeder 5 for a raw powder of the coating material, a feeder 6 for particles of the core material, and a product collecting section 7.

The plasma torch 1 includes a quartz tube 8 having an internal diameter of 44 mm and a length of 150 mm. The quartz tube 8 is surrounded by a high-frequency oscillation coil 9 which is in turn encircled by an outer cooling sleeve 10. The top of the plasma torch has three gas outlet ports, tangential outlet port 11, axial outlet port 12 and radial outlet port 13. These outlet ports receive a mixed gas of argon and nitrogen from the respective sources of gas 14, 15 and 16 at a rate of 5 and 20 lit/min, respectively. The gas discharged from the outlet ports is formed into a plasma by means of an applied source of high-frequency power to form a plasma flame within the plasma torch 1.

The plasma torch 1 also includes, at its bottom, a port 17 for feeding a raw powder of the coating material. The raw powders of yttrium oxide fed through the feeder 5 are introduced into the plasma flame at a rate of 60 g/hr while being carried by the argon carrier gas 18 supplied at a rate of 10 lit/min.

The double-walled quartz tube 2 comprises an inner quartz tube 19 having an internal diameter of 120 mm and a length of 200 mm and an outer cooling tube 20. The double-walled cooling tube 3 includes an inner tube 21 having an internal diameter of 120 mm and a length of 100 mm and an outer cooling tube 22.

The chamber 4 comprises an inner tube 23 having an internal diameter of 440 mm and a length of 1800 mm and an outer cooling tube 24.

The double-walled cooling tube 3 includes a port 25 for feeding the particles of the core material at the middle between the upper and lower ends, through which particles of silicon nitride from the feeder 6 are introduced into the chamber at a rate of 120 g/hr while being carried by an argon carrier gas 26 supplied at a rate of 10 lit/min.

In this manner, the silicon nitride particles are brought into contact with the ultrafines of yttrium oxide in a fluidized state within the double-walled cooling tube 3 and the chamber 4, in which silicon nitride particles are coated on their surfaces with yttrium oxide ultrafines.

The coated particles thus produced are removed from the apparatus by pump 28 through the product collecting section 7 having a cellulose and ceramic filter 27.

Each of the silicon nitride particles (0.1–several μm) obtained was uniformly coated with $Y_2O_3$ ultrafines (0.01–0.05 μm, predominantly 0.02 μm). The amount of $Y_2O_3$ coated was analyzed as 30% by weight. When the coated particles were dispersed ultrasonically in ethanol and separated by sedimentation, it was found that the $Y_2O_3$ ultrafines did not separate from the coated Si$_3$N$_4$ particles thereby demonstrating a coating of the ultrafines firmly adhered on Si$_3$N$_4$ particles. The coated Si$_3$N$_4$ particles of the invention were found to have good fluidity without any agglomeration, whereas a mere mixture of Y$_2$O$_3$ ultrafines and Si$_3$N$_4$ particles demonstrates poor fluidity. Further, the coated particles of the invention have good compatibility and could be readily compacted in the sintering process.

EXAMPLE 2

Using the same apparatus as in Example 1, diamond particles were coated with cobalt ultrafines.

Argon, nitrogen and hydrogen were introduced into the plasma torch at a rate of 5, 20 and 5 lit/rain, respectively to form a plasma flame. At a rate of 60 g/hr, cobalt was introduced into the plasma flame while being carried by an argon carrier gas supplied at a rate of 10 lit/min, by which ultrafines of cobalt were formed.

Subsequently, diamond particles having an average particle size of 1 µm were introduced at a rate of 60 to 120 g/hr while being carried by an argon carrier gas supplied at a rate of 10 lit/rain, and the diamond particles were brought into contact with the cobalt ultrafines in a fluidized state.

The cobalt ultrafines formed from the aforementioned procedure were of a uniform particle size of about 0.02 µm and coated substantially uniformly onto the whole surface of the diamond particles. The amount of cobalt coated was analyzed as 20–50% by weight.

The same separation test as in Example 1 revealed that the ultrafines were firmly bonded to the diamond particles. The coated diamond particles were less agglomerated with increased fluidity. Thus, they were more easily handled with improved sinterability.

EXAMPLE 3

The diamond particles were coated with the carbon ultrafines using the same apparatus as in Example 1, but replacing the feeder for a raw powder of the coating material by methane gas.

To the gas ports (11, 12, 13) provided on the top of the plasma torch 1, argon was fed at a rate of 20 lit/min from the gas feed sources (14, 15, 16). The gas discharged from the gas ports was formed into plasma by means of an applied source of high-frequency power to form a plasma flame in the plasma torch.

Methane (CH$_4$) was introduced from the feed port 17 into the plasma flame at a rate of 0.5 lit/min.

The diamond particles (particle size 40–60 µm) supplied from the feeder 6 were introduced from the port 25 into the plasma flame at a rate of 60 g/hr while being carried by the argon carrier gas 26 supplied at a rate of 10 lit/min.

In this manner, the diamond particles were brought into contact with the carbon ultrafines in a fluidized state within the double-walled cooling tube 3 and the chamber 4, upon which the diamond particles were coated on their surfaces with the carbon ultrafines.

The coated diamond particles were removed from the product collecting section 7.

Each of the diamond particles (40–60 µm) obtained from the aforementioned procedure was uniformly coated with the carbon ultrafines (0.01–0.05 µm, predominantly 0.02 µm). The amount of carbon coated was analyzed as 4% by weight. When the coated particles were dispersed ultrasonically in ethanol and separated by sedimentation, it was found that the carbon ultrafines did not separate from the coated diamond particles thereby demonstrating a coating of the ultrafines firmly adhered on diamond particles. The coated diamond particles of the invention were found to have a good fluidity without any agglomeration, whereas a mere mixture of carbon ultrafines and diamond particles was not homogeneous with the separation of particles from each other. Further, the coated particles of the invention have good compatibility and could be readily compacted in the sintering process.

EXAMPLE 4

Using the same apparatus as in Example 1, diamond particles were coated with titanium ultrafines.

Argon and hydrogen were introduced into the plasma torch at a rate of 20 and 5 lit/rain, respectively to form a plasma flame. At a rate of 60 g/hr, titanium chloride was introduced into the plasma flame while being carried by an argon gas carrier supplied at a rate of 10 lit/min, by which there were produced titanium ultrafines.

Subsequently, diamond particles (particle size, 40–60 µm) were introduced at a rate of 60–120 g/hr while being carried by an argon carrier gas supplied at a rate of 10 lit/min, and the diamond particles were brought into contact with the titanium ultrafines in a fluidized state.

The diamond particles (40–60 µm) obtained from the aforementioned procedure were coated uniformly with titanium ultrafines (0.01–0.05 µm, predominantly 0.02 µm). The amount of titanium coated was analyzed as 13% by weight. When the coated particles were dispersed ultrasonically in ethanol and separated by sedimentation, it was found that the titanium ultrafines did not separate from the coated diamond particles thereby demonstrating a coating of the ultrafines firmly adhered on diamond particles. The coated diamond particles of the invention were found to have a good fluidity without any agglomeration, whereas a mere mixture of titanium ultrafines and diamond particles demonstrates poor fluidity. Further, the coated particles of the invention have good compatibility and could be readily compacted in the sintering process.

What is claimed is:

1. A process of producing sinterable coated particles of inorganic material in which core particles of a first inorganic material are coated on their surfaces with a powder of ultrafines having a particle size of less than 0.5 µm of a second inorganic material chemically bonded to the core particles, which comprises generating a powder of ultrafines of the second inorganic material in a vapor phase by a plasma flame in a gas in an ultrafines powder generating zone from a feed supplying material from which the ultrafines are generated to produce the powder of ultrafines in an activated state for chemical combination with the material of the core particles; thereafter introducing said powder of ultrafines in the activated state in the gas of the plasma flame and the core particles of the first inorganic material, while being carried by a carrier gas, into a particle contacting zone in which the core particles are brought into contact with the powder of the ultrafines while the ultrafines are in the activated state, thus having the powder of the ultrafines chemically bonded to the core particles in a gas stream comprising the said carrier gas and the gas of the plasma flame; and recovering the sinterable coated particles from the gas stream.

2. The process of claim 1, wherein the core particles and the ultrafines are composed of the same material.

3. The process of claim 1, wherein the core particles and the ultrafines are composed of different materials.

4. The process of claim 1, wherein the core particles are of an average particle size of 0.1 to 100 μm.

5. The process of claim 1, wherein the ultrafines are of an average particle size of 0.005 to 0.5 μm.

6. The process of claim 1, wherein the core particles and the ultrafines are composed of ceramic materials.

7. The process of claim 1, wherein the core particles are composed of ceramic material and the ultrafines are composed of a metal.

8. The process of claim 1, wherein the ultrafines are composed of yttrium oxide and the core particles are composed of silicon nitride.

9. The process of claim 1, wherein the ultrafines are composed of cobalt and the core particles are diamond particles.

10. The process of claim 1, wherein the ultrafines are composed of carbon and the core particles are diamond particles.

11. The process of claim 1 wherein the ultrafines are composed of titanium and the core particles are diamond particles.

* * * * *